United States Patent
Hsu

(10) Patent No.: US 6,801,448 B2
(45) Date of Patent: Oct. 5, 2004

(54) COMMON BIT/COMMON SOURCE LINE HIGH DENSITY 1T1R R-RAM ARRAY

(75) Inventor: Sheng Teng Hsu, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 0 days.

(21) Appl. No.: 10/306,644

(22) Filed: Nov. 26, 2002

(65) Prior Publication Data

US 2004/0100814 A1 May 27, 2004

(51) Int. Cl.[7] ............................................. G11C 11/00
(52) U.S. Cl. ....................................... 365/148; 365/104
(58) Field of Search ................................. 365/148, 100, 365/104

(56) References Cited

U.S. PATENT DOCUMENTS 4,143,297 A * 3/1979 Fischer ........................ 313/502

OTHER PUBLICATIONS

Article entitled, "Electric–Pulse–Induced reversible resistance change effect in magnetoresistive films", by Liu, Wu and Ignatiev published in Applied Physics Letter, vol. 76, #19, May 8, 2000.

* cited by examiner

Primary Examiner—Thong Q. Le
(74) Attorney, Agent, or Firm—David C. Ripma; Matthew D. Rabdau

(57) ABSTRACT

A common bit/common source line high density 1T1R (one transistor/one resistor) R-RAM array, and method for operating said array are provided. The R-RAM array comprises a first transistor with a drain connected to a non-shared bit line with a first memory transistor. The gates of the first, second, third, and fourth transistors are sequentially connected to a common word line. The R-RAM array comprises at least one common bit line. A second memory resistor is interposed between the drain of the second transistor and the common bit line. Likewise, a third memory resistor is interposed between the drain of the third transistor and the common bit line. A common source line connected to the sources of the third and fourth transistors. The R-RAM array comprises m rows of n sequential transistors.

31 Claims, 9 Drawing Sheets

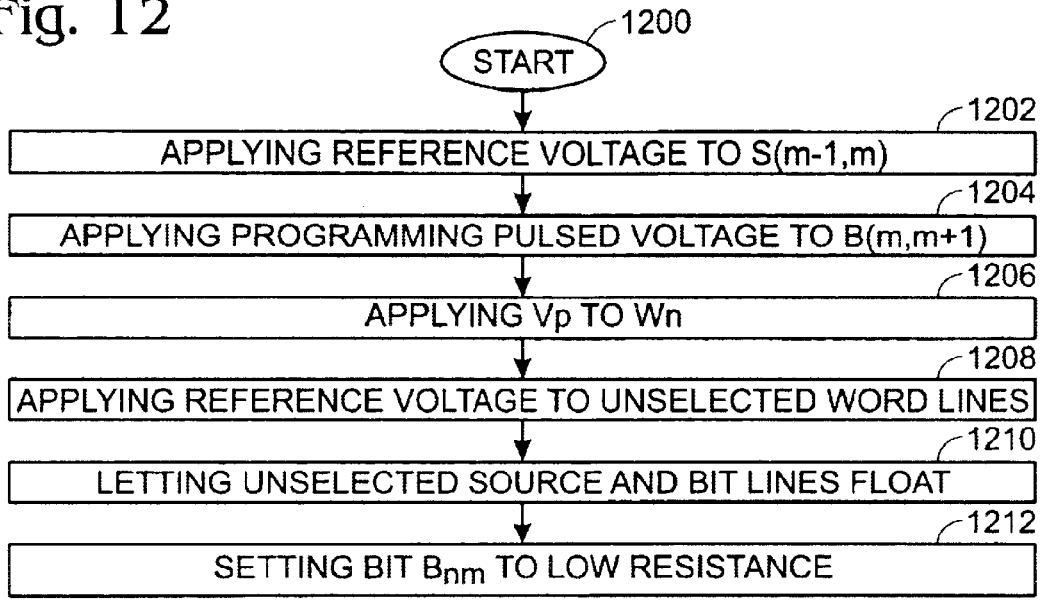
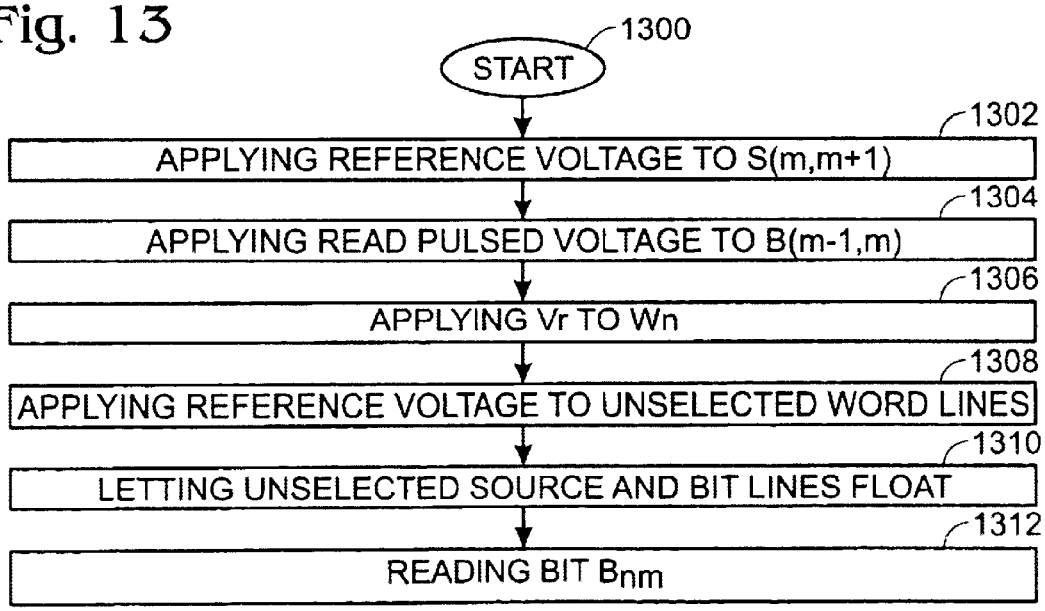

US 6,801,448 B2

COMMON BIT/COMMON SOURCE LINE HIGH DENSITY 1T1R R-RAM ARRAY

BACKGROUND OF THE INVENTION

1. Field of the Invention

This invention generally relates to integrated circuit (IC) fabrication and, more particularly, to an R-RAM memory using common source and common bit lines to increase the array cell density.

2. Description of the Related Art

The density of memory arrays is limited by the resolution of the interconnect line and transistors features. R-RAM memory arrays typically require word, bit, source, or equivalent lines to read, write, and reset the particular transistors. Thus, even if the transistors can be made smaller by finer resolution processes, the size of the array is limited by the numerous interconnect lines, which have line widths that are likewise limited to the resolution of the process.

Liu, Wu and Ignatiev, in "Electric-Pulse-Induced reversible resistance change effect in magnetoresistive films", Applied Physics Letter, Vol. 76, #19, May 8, 2000, revealed their discovery of an electric pulse reversible resistor using a magnetoresistive thin film such as $Pr0.7Ca0.3MnO3$ on a YBCO ($YBa2Cu3O7$) bottom electrode. This electrical pulsed reversible property of the disclosed resistor has application in larger scale non-volatile memory array fabrication.

FIG. 1 is a schematic diagram of an R-RAM memory array with a shared source line (prior art). Note, the circuit of FIG. 1 uses a resistor with electrical pulsed reversible properties. The sources of adjacent bit transistors are connected to a common source line, to reduce the cell area. The use of common source lines, as apposed to non-shared source (reference) lines, results in some improvement in density.

FIG. 2 is the partial cross-sectional view of the common source memory array of FIG. 1 (prior art). If the width of the gate lines, the contact holes, the shallow-trench isolation (STI), and the metal lines are all of the minimum feature size, it is possible to run a metal lines for common source interconnect. However, the pitch (the width of a line plus the spacing between two lines) of long metal lines is larger than double the minimum feature size. Therefore, it is not possible to have a metal line contacting each source without increasing the cell size, even if the metal lines are formed on additional (overlying) metal levels.

It would be advantageous if the density of R-RAM memory arrays could be increased by reducing the number of interconnect lines.

It would be advantageous if the interconnect lines of a high density R-RAM array could be made of metal to improve the response times and efficient of the array.

SUMMARY OF THE INVENTION

The present invention describes a common bit/common source R-RAM configuration that reduces the cell size and increases the yield of chip fabrication. The configuration eliminates the problem of shorting adjacent bit lines, since the total number of bit lines is approximately halved from non-shared (non-common) bit line configurations.

Accordingly, a common bit/common source line high density 1T1R (one transistor/one resistor) R-RAM array is provided. The R-RAM array comprises a first transistor with a drain connected to a non-shared bit line with a first memory transistor, a second transistor, a third transistor, and a fourth transistor. The gates of the first, second, third, and fourth transistors are connected to a common word line. The R-RAM array comprises at least one common bit line. A second memory resistor is interposed between the drain of the second transistor and the common bit line. Likewise, a third memory resistor is interposed between the drain of the third transistor and the common bit line. In some aspects, a common source line connected to the sources of the third and fourth transistors.

More specifically, the R-RAM array comprises m rows of n sequential transistors, where 71 is an even number, with (n−2) interior transistors. The R-RAM array comprises 71 memory resistors, each connected to a corresponding one of the drains of the it transistors. The array comprises m word lines, where each word line is connected to the gates of each of the n transistors in a corresponding row. The R-RAM array comprises ((n/2)−1) common bit lines, where each common bit line is operatively connected to a corresponding pair of adjoining interior transistors through corresponding memory resistors, in each row. There are (n/2) common source lines, where each common source line is connected to corresponding pairs of adjoining transistor sources, in each row.

Additional details of the above-described R-RAM array and associated methods for reading, writing, and resetting the R-RAM array are described below.

BRIEF DESCRIPTION OF THE DRAWINGS

FIG. 12 is a flowchart illustrating an alternate method, from the method of FIG. 11 for resetting a high density 1T1R n by m R-RAM array with common bit/common source lines.

FIG. 13 is a flowchart illustrating the present invention method for reading a high density 1T1R n by m R-RAM array with common bit/common source lines.

DETAILED DESCRIPTION OF THE PREFERRED EMBODIMENTS

Figure 3:
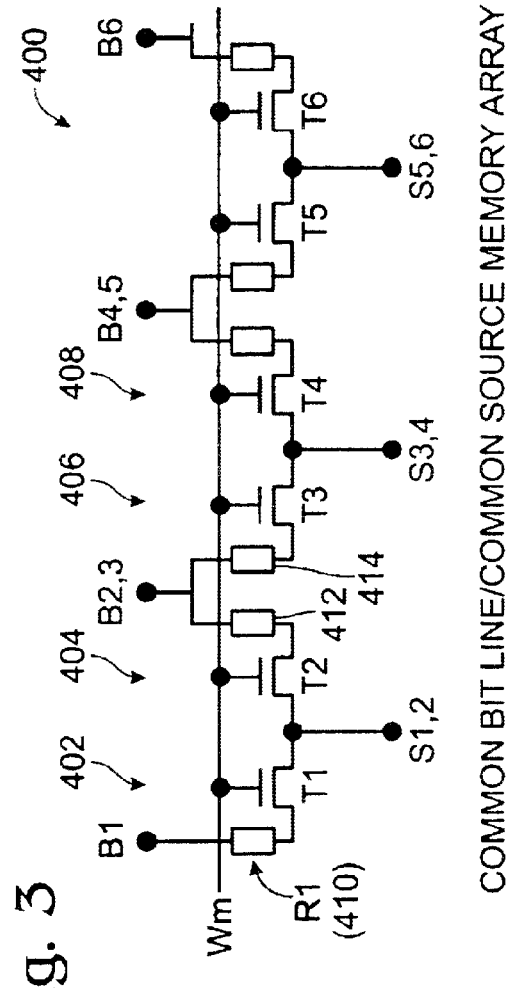
FIG. 3 is a schematic diagram of the present invention common bit/common source line high density 1T1R R-RAM array, showing a single row.

FIG. 3 is a schematic diagram of the present invention common bit/common source line high density 1T1R R-RAM array, showing a single row. Concentrating for the moment on a single word line, word line W1 (m=1) for example, the R-RAM array 400 comprises a first transistor 402 (T1), second transistor 404 (T2), a third transistor 406 (T3), and a fourth transistor 408 (T4). Each transistor has a source, a drain, and a gate. The R-RAM array 400 includes at least one common bit line, bit line B2,3 for example. The R-RAM array 400 also includes at least one non-shared bit line, for example bit line B1.

Figure 4:
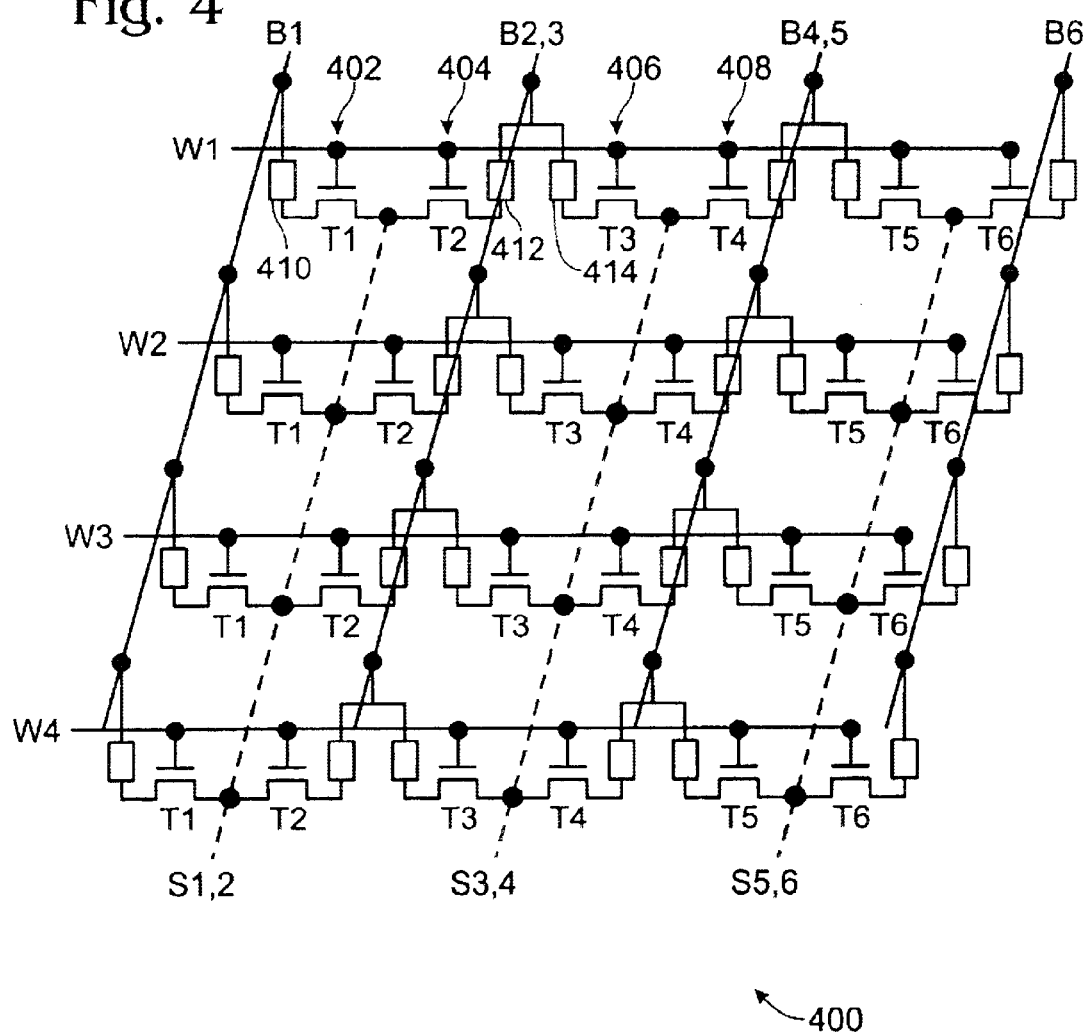
FIG. 4 is a schematic diagram of the present invention common bit/common source line high density 1T1R R-RAM array.

A first memory resistor 410 is interposed between the drain of the first transistor 402 (T1) and bit line B1. A second memory resistor 412 is interposed between the drain of the second transistor 404 (T2) and the common bit line B2,3. A third memory resistor 414 is interposed between the drain of the third transistor 406 (T3) and the common bit line B2,3. As shown, there are six transistors with gates connected to word line W1 (n=6). A common bit line B4,5 is operatively connected to the drains of transistors T4 and T5 through respective memory resistors, and a non-shared bit line B6 is operatively connected to the drain of transistor T6 through a memory resistor. The phrase "operatively connected" as used herein means indirectly connected or connected through one or more intervening elements. Note that the array of FIG. 4 is exemplary and that the value of n is not limited to any particular value.

A common source line S3,4 is connected to the sources of the third transistor 406 (T3) and the fourth transistor 408 (T4). As shown, common source line S1,2 is connected to the sources of the first transistor 402 (T1) and the second transistor 404 (T2). Common source line S5,6 is connected to the sources of transistors T5 and T6.

The R-RAM array 400 shown exemplifies a case where n is an even number. Then, the RAM array 400 comprises a row of n sequential transistors with gates, sources, and drains. A "row" is considered to be the set of transistors connected to the same word line. Each row includes (n−2) interior transistors. As shown, the interior transistors are T2, T3, T4, and T5. (n) memory resistors are included, each memory resistor is connected to a corresponding one of the drains of the n transistors. That is, the first memory resistor 410 is connected to the drain of the first transistor 402 (T1) and the nth memory resistor is connected to the drain of the nth transistor. As mentioned above, the word line, in this case W1, is connected to the gates of each of the it transistors.

The R-RAM array 400 comprises ((n/2)−1) common bit lines. Each common bit line is operatively connected to a corresponding pair of adjoining interior transistors through corresponding memory resistors. For example, bit line B2,3 is connected to the second transistor 404 (T2) through the second memory resistor 412 and the third transistor 406 (T3) through the third memory resistor 414.

The R-RAM array 400 includes (n/2) common source lines. Each common source line is connected to corresponding pairs of adjoining transistor sources. For example, source line S1,2 is connected to the sources of the first transistor 402 (T1) and the second transistor 404 (T2).

A first exterior bit line (B1) is operatively connected to a first transistor (n=1) through a corresponding memory resistor. As shown, bit line B1 is connected to the first transistor 402 (T1) through the first memory resistor 410. A second exterior bit line (Bn) is operatively connected to an nth transistor through a corresponding memory resistor. As shown in the figure, the second exterior bit line is B6.

FIG. 4 is a schematic diagram of the present invention common bit/common source line high density 1T1R R-RAM array. Now that the general rule has been developed for a single row (FIG. 3), the entire array can be considered. The R-RAM array 400 comprises m rows of n sequential transistors with gates, sources, and drains. As above, each row of transistors includes (n−2) interior transistors. As shown in FIG. 4, m is an exemplary value equal to 4. However, the present invention is not limited to any particular value of m. Previously, the discussion has focused on word line W1 (m=1). There are nt memory resistors for each of the m rows, each memory resistor being connected to a corresponding one of the drains of the n transistors in each row. Alternately stated, each transistor has a corresponding memory resistor connected to its drain. There are m word lines, where each word line is connected to the gates of each of the n transistors in a corresponding row. Alternately stated, a word line is connected to the all the transistor gates in its row.

The ((n/2)−1) common bit lines are each operatively connected to corresponding pairs of adjoining interior transistors, through corresponding memory resistors, in each row. For example, the bit line B2,3 is operatively connected to the drains of T2 and T3 in each row. The (n/2) common source lines are each connected to corresponding pairs of adjoining transistor sources, in each row. For example, the source line S1,2 is connected to the sources of T1 and T2 in each row.

The first exterior bit line (B1) is operatively connected to the first transistor, through a corresponding memory resistor, in each row. Likewise, the second exterior bit line (Bn) is operatively connected to the nth transistor, through a corresponding memory resistor, in each row.

Figure 5:
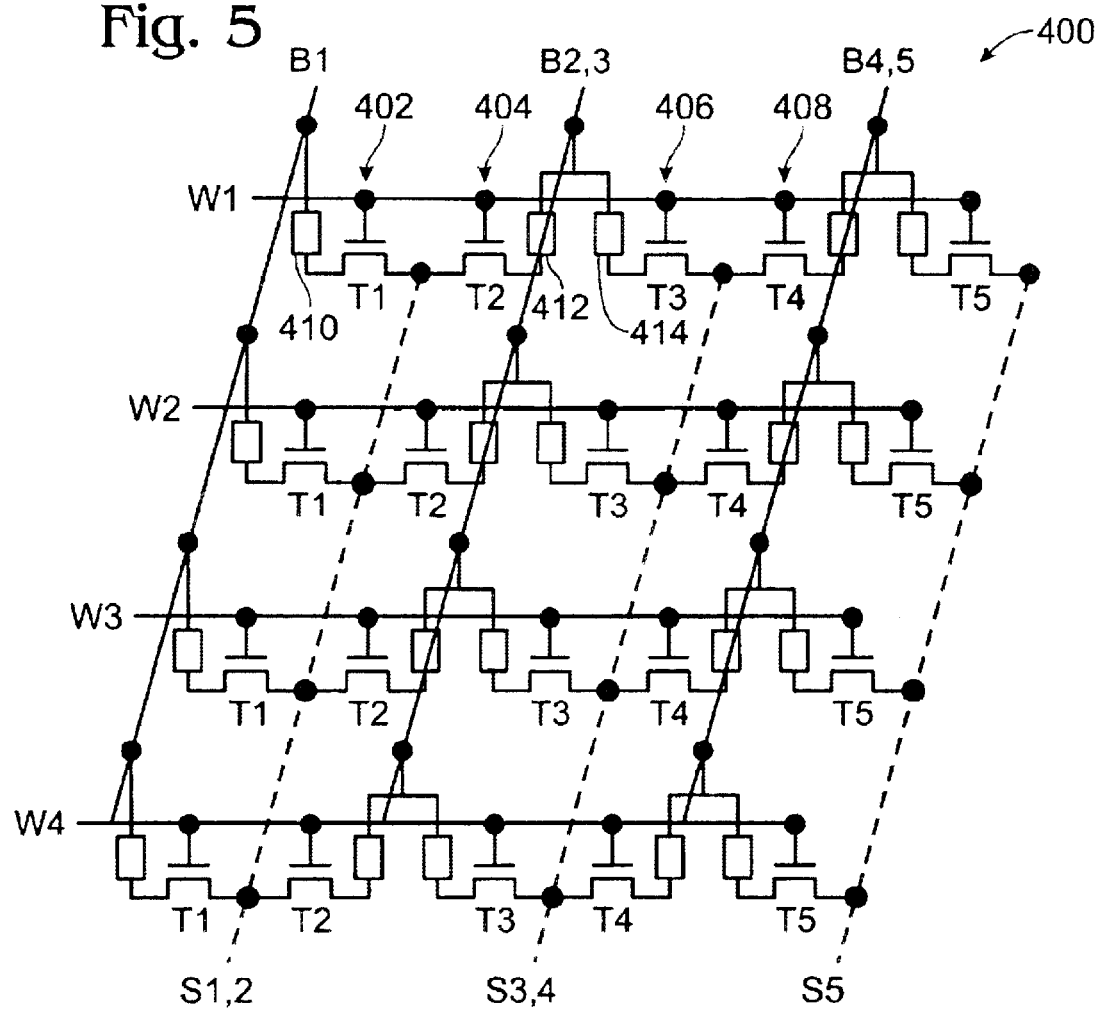
FIG. 5 is a schematic of the present invention R-RAM array in the case where n is an odd number.

FIG. 5 is a schematic of the present invention R-RAM array in the case where n is an odd number. As shown, n is equal to 5, but once again the present invention is not limited to any particular value of n. Any row, the row associated with W1 for example, includes n sequential transistors with gates, sources, and drains, including (n−1) interior transistors. In this case the interior transistors are T2 through Tn. When n is an odd number, an interior transistor is defined to be a transistor that is operatively connected to a common bit line. There are n memory resistors, each connected to a corresponding one of the drains of the n transistors. As above, the word line W1 (for example) is connected to the gates of each of the n transistors in the first row. There are ((n−1)/2) common bit lines, where each common bit line operatively connected to a corresponding pair of adjoining interior transistors through corresponding memory resistors. There are also ((n−1)/2) common source lines, each common source line connected to corresponding pairs of adjoining transistor sources.

A first exterior bit line (B1) is operatively connected to the first (n=1) transistor through a corresponding memory resistor. A first exterior source line (Sn) is connected to the source of the nth transistor.

Considering the array as a whole, there are m rows of n sequential transistors with gates, sources, and drains, where each row of transistors including (n−1) interior transistors. There are n memory resistors for each of the m rows. Each memory resistor is connected to a corresponding one of the drains of the n transistors in each row. There are m word lines, each word line is connected to the gates of each of the n transistors in a corresponding row. The ((n−1)/2) common bit lines are each operatively connected to corresponding pairs of adjoining interior transistors, through corresponding memory resistors, in each row. The ((n−1)/2) common source lines are each connected to corresponding pairs of adjoining transistor sources, in each row.

The first exterior bit line (B1) is operatively connected to the first transistor, through a corresponding memory resistor, in each row. The first exterior source line (Sn) is connected to the source of the nth transistor in each row.

Figure 6:
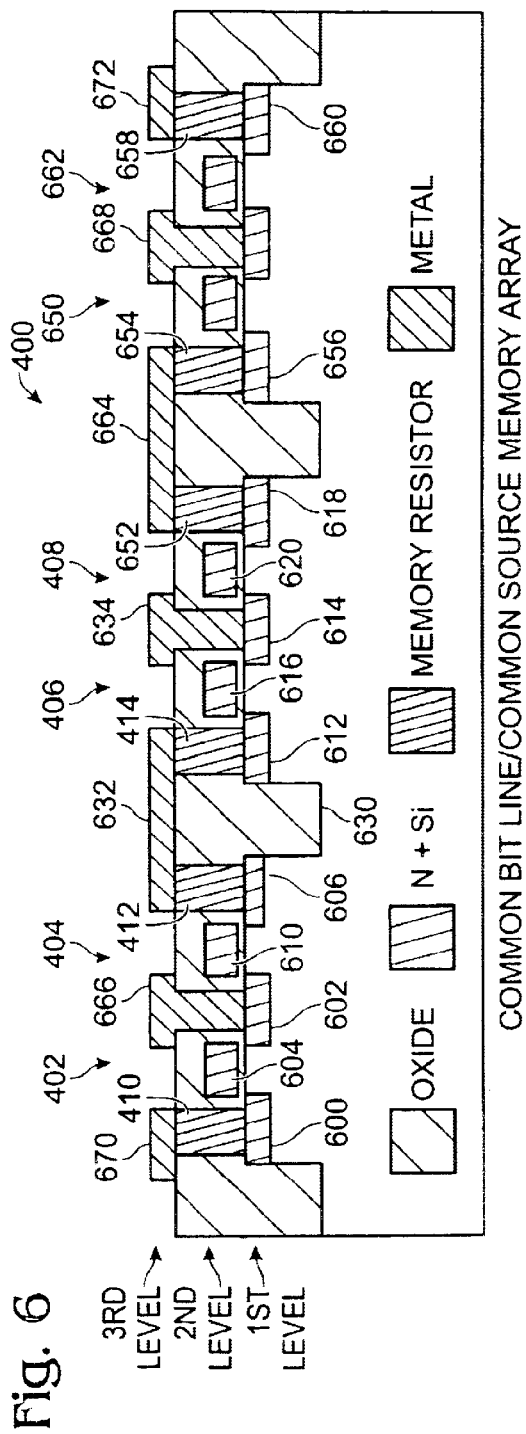
FIG. 6 is a partial cross-sectional view of the present invention common bit/common source line high density 1T1R R-RAM array of FIGS. 3 and 4.

FIG. 6 is a partial cross-sectional view of the present invention common bit/common source line high density 1T1R R-RAM array of FIGS. 3 and 4. Considered in conjunction with FIGS. 3 and 4, the figure represents a cross-section of the array structures associated with W1 for example. Shown are the first transistor 402, with a drain 600, source 602, and a gate 604. The second transistor 404 has a drain 606, source 602, and a gate 610. The third transistor 406 has a drain 612, a source 614, and a gate 616. The fourth transistor 408 has a drain 618, a source 614, and a gate 620. Each of the sources and drains are in a first level, and the gates are formed in an overlying level.

Focusing on a one pair of interior transistors, an insulator 630 is formed in the first level, interposed between the second transistor drain 606 and the third transistor drain 612, and in a second level overlying the first level. In some aspects as shown, the insulator 630 is a layered insulator formed in separate processes. The second memory resistor 412 is formed in the second level and connected to the drain 606 of the second transistor 404. The third memory resistor 414 is formed in the second level and connected to the drain 612 of the third transistor 406. The common bit line 632 (B2,3) is connected to the second and third memory resistors 412/414. The memory resistors 412/414 can be made from a colossal magnetoresistive (CMR) film, such as $Pr_{0.3}Ca_{0.7}MnO_3$ (PCMO), $La_{0.7}Ca_{0.3}MnO_3$ (LCMO), or $Y_{1-x}Ca_xMnO_3$ (YCMO), or a high-temperature super conductor (HTSC) material.

As shown, the second memory resistor 412 overlies the drain 606 of the second transistor 404 and the third memory resistor 414 overlies the drain 612 of the third transistor 406. Alternate configurations are possible, but the directly overlying configuration shown enhances cell density.

The common source line 634 (S3,4) is connected to the sources 614 of the third transistor 406 and the fourth transistor 408. In some aspects as shown, adjoining transistors actually share a common source. That is, the sources of adjoining transistors are a single shared source. In some aspects, the common source line 634 is formed in the second level overlying the sources 614 of the third and fourth transistors. In other aspects as shown, the common source line 634 is also formed in a third level, overlying the second level. Alternately stated, a via is formed in the second layer to connect the sources to the common source line at the third level.

The common bit and common source lines can be formed in a common level. As shown, the common bit line 632 and the common source line 634 are formed in the third level. The reduction in the total number of bit lines brought about by the present invention common bit line concept permits either, or both the sense and bit lines to be fabricated from metal, even though the metal lines have a width that is inherently wider than non-metal bit and sense lines made more a material such as silicided polycrystalline silicon. For example, the common source and common bit lines can be made from a metal material such as aluminum (Al), titanium (Ti), silicon doped aluminum (AlSi), or copper (Cu). However, the present invention interconnect lines are not limited to any particular type of metal.

A common word line is formed in a level overlying the first level and connected to the gate 604 of the first transistor 402, the gate 610 of the second transistor 404, the gate 616 of the third transistor 406, and the gate 620 of the fourth transistor 408 (and the gates of all the other transistors in the common row). This common word line is not visible in FIG. 6, but could been seen if a different cross-section of the array were presented.

One common bit line 632, and its associated transistor and memory resistor structures, has been described in detail above. Likewise, one common source line 634, and its associated transistor structures, has been described. These descriptions would generally explain other common bit line and common source line structures in the present invention R-RAM array. Redundant explanations of these structures are omitted in the interest of brevity.

More generally, a row of n sequential transistors with gates, sources, and drains, is included with (n−2) interior transistors. The interior transistors are transistors 404, 406, 408, and 650. (n) memory resistors are included, each connected to a corresponding one of the drains of the n transistors. As shown, memory resistor 410 is connected to drain 600, memory resistor 412 is connected to drain 606, memory resistor 414 is connected to drain 612, a memory resistor 652 is connected to the drain 618 of transistor 408, a memory resistor 654 is connected to the drain 656 of transistor 650, and a memory resistor 658 is connected to the drain 660 of transistor 662.

The R-RAM array includes ((n/2)−1) common bit lines, each common bit line operatively connected to a corresponding pair of adjoining interior transistors through corresponding memory resistors. Shown are common bit lines 632 and 664. There are (n/2) common source lines, each common source line connected to corresponding pairs of adjoining transistor sources. Shown are common source lines 634, 666, and 668. The first exterior bit line 670 (B1) is operatively connected to the first transistor 402 through a corresponding (first) memory resistor 410. A second exterior bit line 672 is operatively connected to an nth transistor 662 through a corresponding (nth) memory resistor 658.

Considered in conjunction with FIG. 4 it can be extrapolated that the R-RAM array 400 may include m rows of n sequential transistors, where each row is identical to the row actually described in FIG. 6. Then, the R-RAM array 400 would include n memory resistors for each of the m rows, each connected to a corresponding one of the drains of the n transistors in each row. The R-RAM array would include m word lines, where each word line connected to the gates of each of the n transistors in a corresponding row. The ((n/2)−1) common bit lines would be operatively connected to corresponding pairs of adjoining interior transistors, through corresponding memory resistors, in each row. The (n/2) common source lines would be connected to corresponding pairs of adjoining transistor sources, in each row. The first exterior bit line 670 would be operatively connected to the first transistor, through a corresponding memory resistor, in each row. Likewise, the second exterior bit line 672 would be operatively connected to the nth transistor, through a corresponding memory resistor, in each row.

Figure 7:
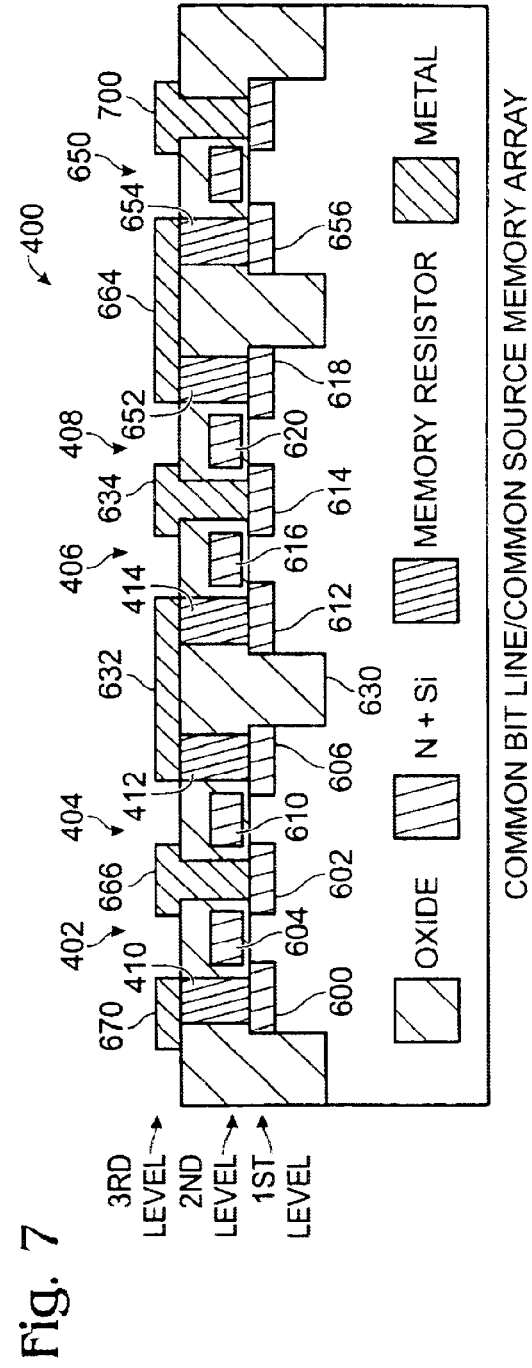
FIG. 7 is a partial cross-sectional view of the present invention common bit/common source line high density 1T1R R-RAM array of FIG. 5.

FIG. 7 is a partial cross-sectional view of the present invention common bit/common source line high density 1T1R R-RAM array of FIG. 5. Much of the explanation of FIG. 6 applies with equal relevance to FIG. 7. Unlike FIG. 6, the row in FIG. 7 does not include transistor 662, as n is an odd number. Therefore, memory resistor 658 and the second exterior bit line 672 are not included in FIG. 7.

When n is an odd number, the row of n sequential transistors includes (n−1) interior transistors, as interior transistor has been defined above. That is, transistors 404, 406, 408, and 650 are interior transistors. Then, there are ((n−1)/2) common bit lines, where each common bit line is operatively connected to a corresponding pair of adjoining interior transistors through corresponding memory resistors. Shown are common bit lines 632 and 664. There are (n−1)/2 common source lines, each common source line connected to corresponding pairs of adjoining transistor sources. Shown are common sense lines 634 and 666.

The first exterior bit line 670 (B1) is operatively connected to the first (n=1) transistor 402 through a corresponding (first) memory resistor 410. A first exterior source line 700 (S5) is connected to the source of the nth transistor 650.

Considered in conjunction with FIG. 5 it can be extrapolated that the R-RAM array 400 may include m rows of n sequential transistors, where each row of transistors includes (n−1) interior transistors. The R-RAM array 400 would include n memory resistors for each of the m rows, each connected to a corresponding one of the drains of the n transistors in each row. The R-RAM array would include m word lines, each word line connected to the gates of each of the n transistors in a corresponding row. The ((n−1)/2) common bit lines would be operatively connected to corresponding pairs of adjoining interior transistors, through corresponding memory resistors, in each row. The ((n−1)/2) common source lines would be connected to corresponding pairs of adjoining transistor sources, in each row. The first exterior bit line 670 would be operatively connected to the first transistor, through a corresponding memory resistor, in each row. The first exterior source line 700 would be connected to the source of the nth transistor in each row.

Functional Description

Figure 1:
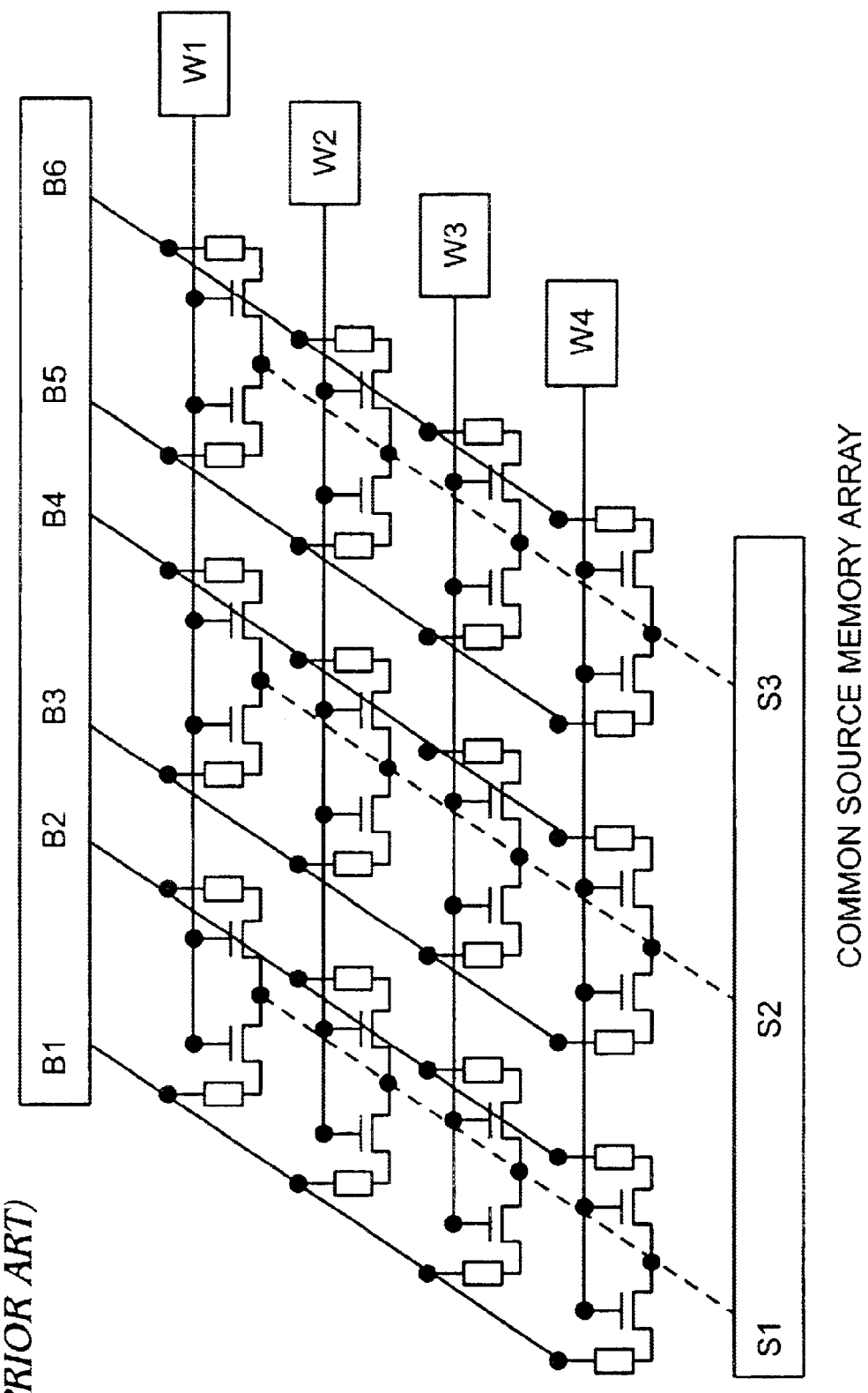
FIG. 1 is a schematic diagram of an R-RAM memory array with a shared source line (prior art).
Figure 2:
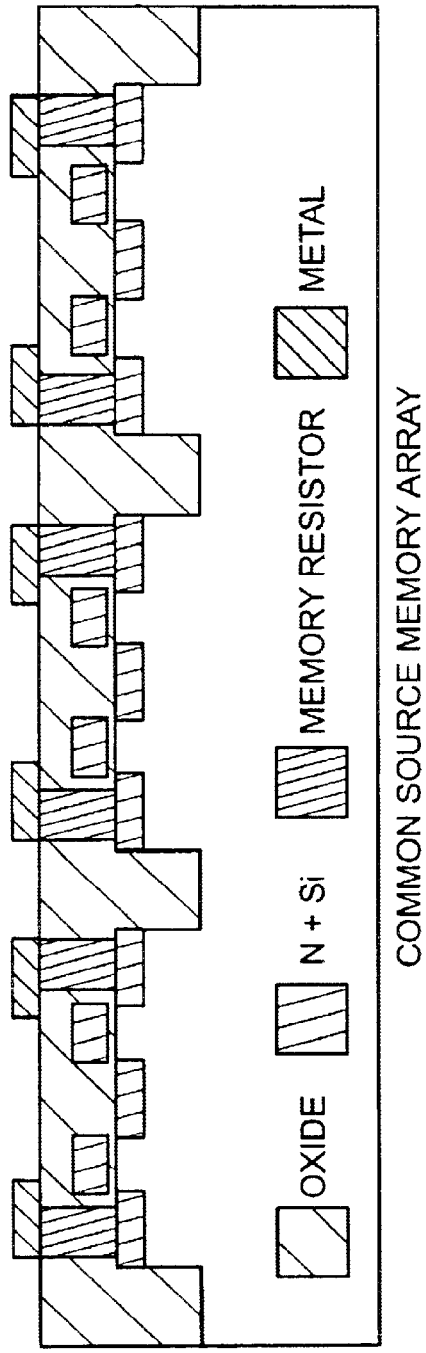
FIG. 2 is the partial cross-sectional view of the common source memory array of FIG. 1 (prior art).

Returning to FIG. 4 or 5, the figures show bit cells along a word line. Adjacent bits share a common bit line. For example, bit line B4,5 is the shared bit line for bit 4 and 5. Bit 1 and 2 share the common source line of S1,2. Thus, the actual number of bit lines in a given array is about one half as many as that shown in FIG. 1. In addition, the common source line can be a low resistance metal line running in parallel to the bit lines. This metal common source line is an option not available in conventional common source line configurations, without an increase in the memory size of more than 30%.

Returning to FIGS. 6 and 7, it can be seen that the present invention common bit line/common source line structure creates enough space to run a metal line, in parallel to the bit lines, to connect each bit transistor source. The common source metal line can either be on the same metal level, or a different metal level than the common bit line.

Figure 8:
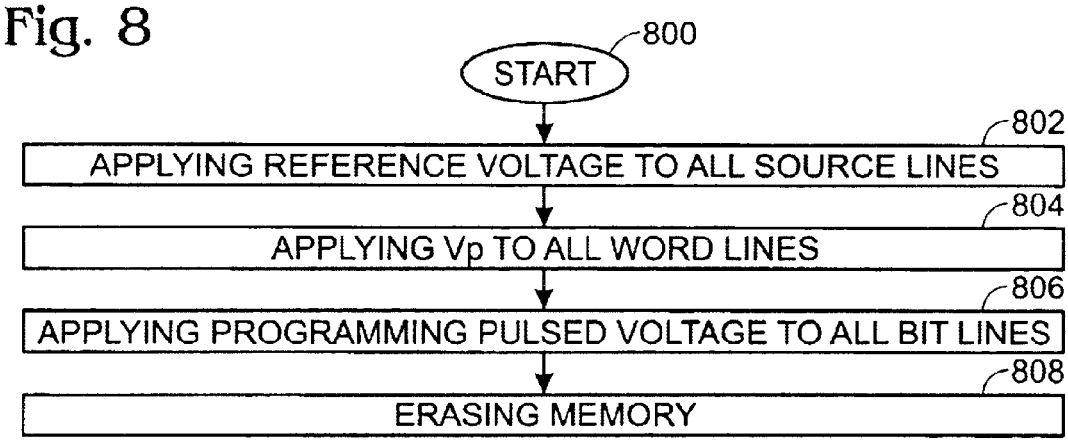
FIG. 8 is a flowchart illustrating the present invention method for erasing memory in a high density 1T1R n by m R-RAM array with common bit/common source lines.

FIG. 8 is a flowchart illustrating the present invention method for erasing memory in a high density 1T1R n by m R-RAM array with common bit/common source lines. Although the method (and the methods described below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 800. Step 802 applies a reference voltage to all source lines. Step 804 applies a programming voltage (Vp) to all word lines. Step 806 applies a programming pulsed voltage to all bit lines. Step 808 erases the memory contents of the R-RAM array in response to the applied voltages.

In some aspects, applying a reference voltage to all source lines in Step 802 includes the reference being ground. Then, applying a programming voltage (Vp) to all word lines in Step 804 includes Vp being in the range between 2 and 6 volts. Applying a programming pulsed voltage to all bit lines in Step 806 includes the pulse width being in the range of 1 and 1000 nanoseconds (ns) and the pulse amplitude being in the range between −3 and −6 volts. Alternately, applying a programming pulsed voltage to all bit lines in Step 806 includes the pulse width being longer than 1 microsecond and the pulse amplitude being in the range between 2 and 6 volts.

Figure 9:
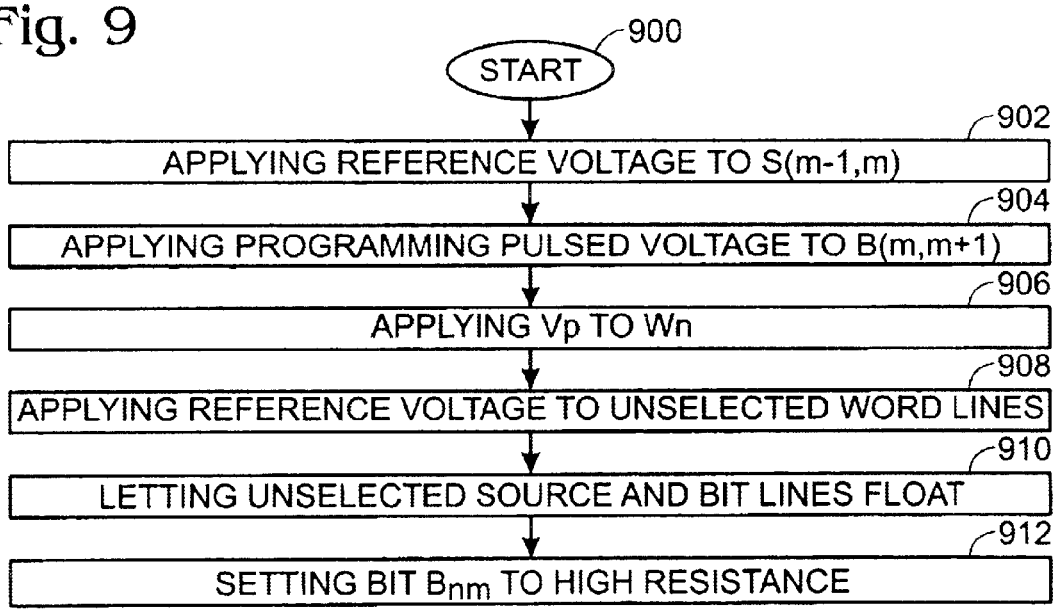
FIG. 9 is a flowchart illustrating the present invention method for writing to a high density 1T1R n by m R-RAM array with common bit/common source lines.

FIG. 9 is a flowchart illustrating the present invention method for writing to a high density 1T1R n by m R-RAM array with common bit/common source lines. The method starts at Step 900. Step 902 applies a reference voltage to selected source line S(n−1, n). Step 904 applies a programming pulsed voltage to selected bit line B(n, n+1). Step 906 applies a programming voltage (Vp) to a selected word line Wm. Step 908 applies the reference voltage to all unselected word lines. Step 910 lets unselected source lines and bit lines float. Step 912 sets the bit Bnm to a high resistance memory state in response to the applied voltages.

In some aspects, applying a reference voltage in Step 902 and 908 includes the reference voltage being ground. Applying a programming voltage (Vp) to a selected word line in Step 906 includes Vp being in the range between 2 and 6 volts. Applying a programming pulsed voltage to selected bit line B(n, n+1) in Step 904 includes the pulsed voltage having a pulse width in the range of 1 and 300 nanoseconds (ns) and an amplitude in the range of 3 and 6 volts.

Figure 10:
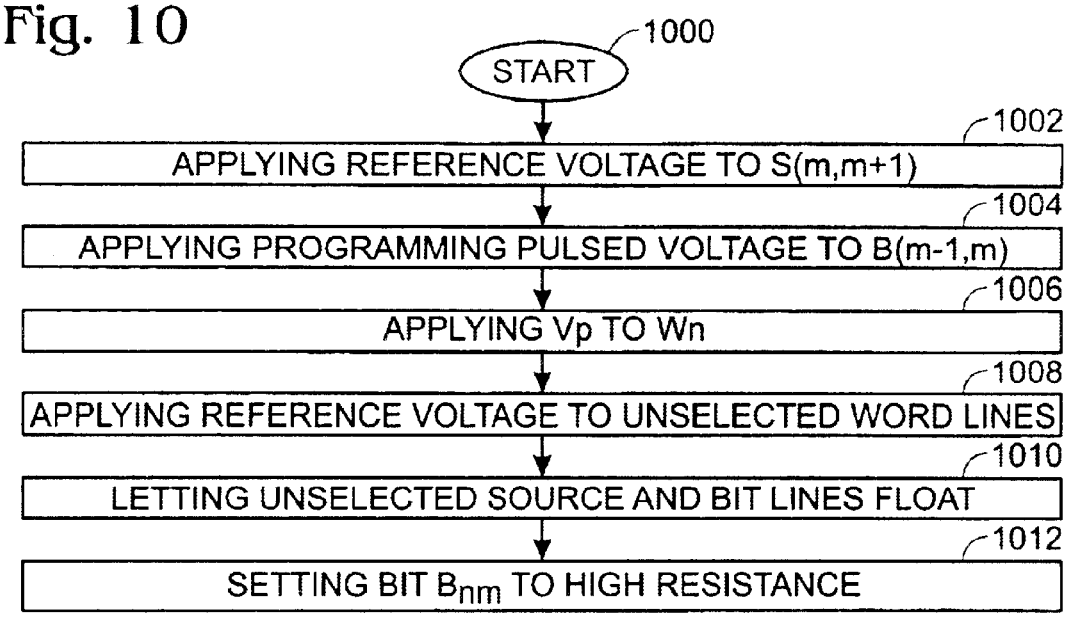
FIG. 10 is a flowchart illustrating an alternate method from the method of FIG. 9 for writing a high resistance memory state.

FIG. 10 is a flowchart illustrating an alternate method from the method of FIG. 9 for writing a high resistance memory state. The method starts at Step 1000. Step 1002 applies a reference voltage to selected source line S(n, n+1). Step 1004 applies a programming pulsed voltage to selected bit line B(n−1, n). Step 1006 applies a programming voltage (Vp) to a selected word line Wm. Step 1008 applies the reference voltage to all unselected word lines. Step 1010 lets unselected source lines and bit lines float. Step 1012 sets the bit Bnm to a high resistance memory state in response to the applied voltages.

In some aspects, applying a reference voltage in Step 1002 and 1008 includes the reference voltage being ground. Applying a programming voltage (Vp) to a selected word line in Step 1006 includes Vp being in the range between 2 and 6 volts. Applying a programming pulsed voltage to selected bit line B(n−1, a) in Step 1004 includes the pulsed voltage having a pulse width in the range of 1 and 300 nanoseconds (ns) and an amplitude in the range of 3 and 6 volts.

Figure 11:
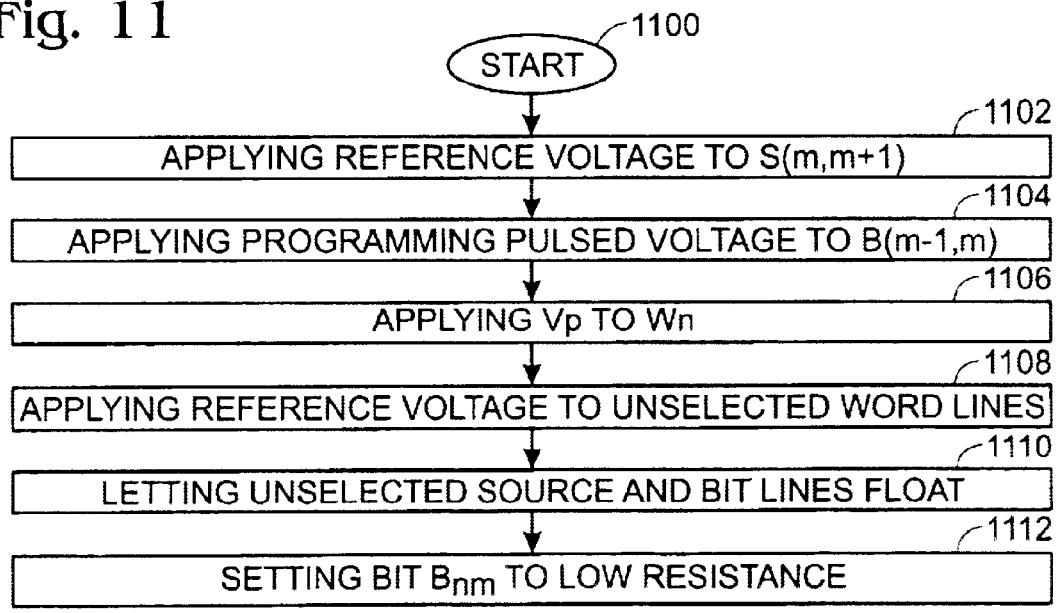
FIG. 11 is a flowchart illustrating the present invention method for resetting a high density 1T1R n by m R-RAM array with common bit/common source lines.

FIG. 11 is a flowchart illustrating the present invention method for resetting a high density 1T1R n by m R-RAM array with common bit/common source lines. The method starts at Step 1100. Step 1102 applies a reference voltage to selected source line S(n, n+1). Step 1104 applies a programming pulsed voltage to selected bit line B(n−1, n). Step 1106 applies a programming voltage (Vp) to a selected word line Wm. Step 1108 applies the reference voltage to all unselected word lines. Step 1110 lets unselected source lines and bit lines float. Step 1112 sets the bit Bnm to a low resistance memory state in response to the applied voltages.

In some aspects, applying a reference voltage in Step 1102 and 1108 includes the reference voltage being ground. Applying a programming voltage (Vp) to a selected word line in Step 1106 includes Vp being in the range between 2 and 6 volts. Applying a programming pulsed voltage to selected bit line B(n−1, n) in Step 1104 includes the pulsed voltage having a pulse width greater than 100 ns and an amplitude in the range of 2 and 6 volts.

FIG. 12 is a flowchart illustrating an alternate method, from the method of FIG. 11 for resetting a high density 1T1R n by m R-RAM array with common bit/common source lines. The method starts at Step 1200. Step 1202 applies a reference voltage to selected source line S(n−1, n). Step 1204 applies a programming pulsed voltage to selected bit line B(n, n+1). Step 1206 applies a programming voltage (Vp) to a selected word line Wm. Step 1208 applies the reference voltage to all unselected word lines. Step 1210 lets unselected source lines and bit lines float. Step 1212 sets the bit Bnm to a low resistance memory state in response to the applied voltages.

In some aspects, applying a reference voltage in Step 1202 and 1208 includes the reference voltage being ground. Applying a programming voltage (Vp) to a selected word line in Step 1206 includes Vp being in the range between 2 and 6 volts. Applying a programming pulsed voltage to selected bit line B(n, n+1) in Step 1204 includes the pulsed voltage having a pulse width greater than 100 ns and an amplitude in the range of 2 and 6 volts.

FIG. 13 is a flowchart illustrating the present invention method for reading a high density 1T1R n by m R-RAM array with common bit/common source lines. The method starts at Step 1300. Step 1302 applies a reference voltage to selected source line S(n, n+1). Step 1304 applies a read pulsed voltage to selected bit line B(n−1, n). Step 1306 applies a read voltage (Vr) to a selected word line Wm. Step 1308 applies the reference voltage to all unselected word lines. Step 1310 lets unselected source lines and bit lines float. Step 1312 reads the bit Bnm in response to the applied voltages.

In some aspects, applying a reference voltage in Steps 1302 and 1308 includes the reference voltage being ground. Applying a read pulsed voltage to selected bit line B(n−1, n) in Step 1304 includes the read pulse having a pulse width in the range between 1 and 100 nanoseconds (ns) and an amplitude in the range between 0.1 and 1.5 volts. Applying a read voltage (Vr) to a selected word line Wm in Step 1306 includes Vr being in the range between 1 and 3 volts.

Figure 14:
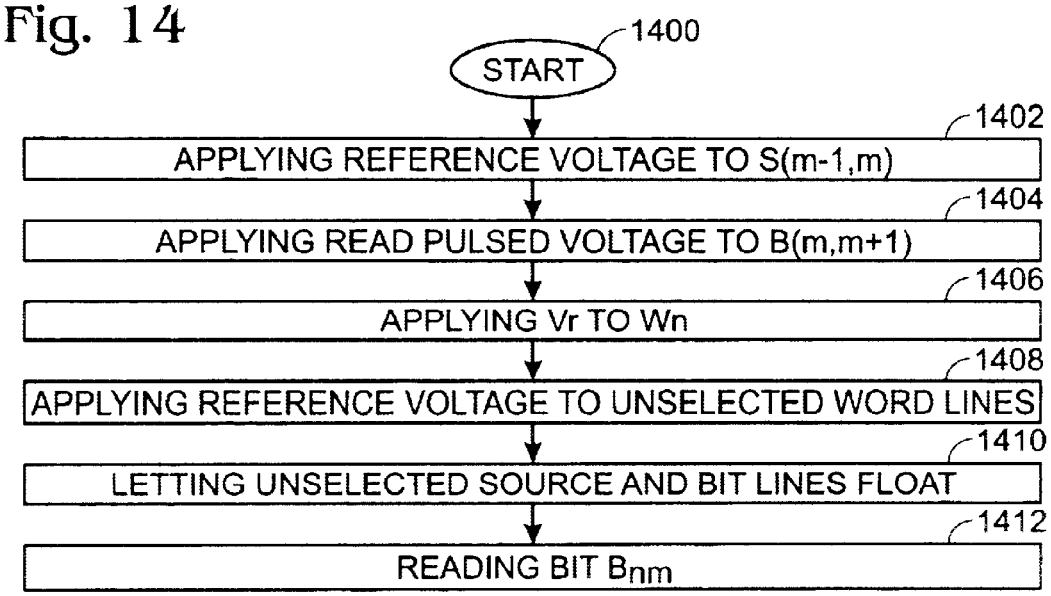
FIG. 14 is a flowchart illustrating an alternate method for reading a high density 1T1R n by m R-RAM array with common bit/common source lines.

FIG. 14 is a flowchart illustrating an alternate method for reading a high density 1T1R n by m R-RAM array with common bit/common source lines. The method starts at Step 1400. Step 1402 applies a reference voltage to selected source line S(n−1, n). Step 1404 applies a read pulsed voltage to selected bit line B(n, n+1). Step 1406 applies a read voltage (Vr) to a selected word line Wm. Step 1408 applies the reference voltage to all unselected word lines. Step 1410 lets unselected source lines and bit lines float. Step 1412 reads the bit Bnm in response to the applied voltages.

In some aspects, applying a reference voltage in Step 1402 and 1408 includes the reference voltage being ground. Applying a read pulsed voltage to selected bit line B(n, n+1) in Step 1404 includes the read pulse having a pulse width in the range between 1 and 100 nanoseconds (ns) and an amplitude in the range between 0.1 and 1.5 volts. Applying a read voltage (Vr) to a selected word line Wm in Step 1406 includes Vr being in the range between 1 and 3 volts.

A common bit/common source line high density 1T1R R-RAM array, and method for operating the above-mentioned array have been provided. Specific examples of the R-RAM array have been given with the values of it being 5 or 6, and the value of m being 4. However, the present invention is not limited to any particular n or m values. Likewise, specific voltage values have been presented in the operation methods as a way of illustration. The present invention R-RAM array could alternately be operated with different absolute voltages, by maintaining the disclosed relationship between operation voltages. Other variations and embodiments of the invention will occur to those skilled in the art.

We claim:

1. A common bit/common source line high density one transistor/one resistor (1T1R) R-RAM array comprising:
    a first transistor with a gate, source, and drain;
    a second transistor with a gate, source, and drain;
    a common bit line;
    a first memory resistor interposed between the drain of the first transistor and the common bit line; and,
    a second memory resistor interposed between the drain of the second transistor and the common bit line.

2. The R-RAM array of claim 1 further comprising:
    a third transistor with a gate, source, and drain; and,
    a common source line connected to the sources of the second and third transistors.

3. The R-RAM array of claim 2 further comprising:
    a common word line connected to the gates of the first second, and third transistors.

4. The R-RAM array of claim 3 in which n is an even number; and,
    the R-RAM array further comprising:
    a row of n sequential transistors with gates, sources, and drains, including the first, second, and third transistors, the row of transistors including (n-2) interior transistors;
    n memory resistors, including the first and second memory resistors, each connected to a corresponding one of the drains of the n transistors;
    wherein the word line is connected to the gates of each of the n transistors;
    ((n/2) -1) common lines, each common bit line operatively connected to a corresponding pair of adjoining interior transistors through corresponding memory resistors; and,
    (n/2) common source lines, each common source line connected to corresponding pairs of adjoining transistor sources.

5. The R-RAM array of claim 4 further comprising:
    a first exterior bit line (B1) operatively connected to a (n=1) transistor through a corresponding memory resistor; and,
    a second exterior bit line (Bn) operatively connected to an nth transistor through a corresponding memory resistor.

6. The R-RAM array of claim 5 further comprising:
    m rows of n sequential transistors with gates, sources, and drains, each row of transistors including (n−2) interior transistors;
    n memory resistors for each of the m rows, each connected to a corresponding one of the drains of the n transistors in each row;

m word lines, each word line connected to the gates of each of the n transistors in a corresponding row;

wherein the ((n/2)−1) common bit lines are each operatively connected to corresponding pairs of adjoining interior transistors, through corresponding memory resistors, in each row; and, wherein the (n/2) common source lines are each connected to corresponding pairs of adjoining transistor sources, in each row.

7. The R-RAM array of claim 6 wherein the first exterior bit line is operatively connected to the (n=1) transistor, through a corresponding memory resistor, in each row; and, wherein the second exterior bit line is operatively connected to the nth transistor, through a corresponding memory resistor, in each row.

8. The R-RAM array of claim 3 in which n is an odd number; and, the R-RAM array further comprising:

a row of n sequential transistors with gates, sources, and drains, including the first, second, and third transistors, the row of transistors including (n−1) interior transistors;

n memory resistors, including the first and second memory resistors, each connected to a corresponding one of the drains of the n transistors;

wherein the word line is connected to the gates of each of the n transistors;

((n−1)/2) common bit lines, each common bit line operatively connected to a corresponding pair of adjoining interior transistors through corresponding memory resistors; and, ((n−1)/2) common source lines, each common source line connected to corresponding pairs of adjoining transistor sources.

9. The R-RAM array of claim 8 further comprising:

a first exterior bit line (B1) operatively connected to a (n=1) transistor through a corresponding memory resistor; and, a first exterior source line (Sn) connected to the source of an nth transistor.

10. The R-RAM array of claim 9 further comprising:

m rows of n sequential transistors with gates, sources, and drains, each row of transistors including (n−1) interior transistors;

n memory resistors for each of the m rows, each connected to a corresponding one of the drains of the n transistors in each row;

m word lines, each word line connected to the gates of each of the n transistors in a corresponding row;

wherein the ((n−1)/2) common bit lines are each operatively connected to corresponding pairs of adjoining interior transistors, through corresponding memory resistors, in each row; and, wherein the ((n−1)/2) common source lines are each connected to corresponding pairs of adjoining transistor sources, in each row.

11. The R-RAM array of claim 10 wherein the first exterior bit line is operatively connected to the (n=1) transistor, through a corresponding memory resistor, in each row; and, wherein the first exterior source line is connected to the source of the nth transistor in each row.

12. The R-RAM array of claim 1 wherein the first and second memory resistors are made from a material selected from the group including colossal magnetoresistive (CMR) films, such as $Pr_{0.3}Ca_{0.7}MnO_3$(PCMO), $La_{0.7}Ca_{0.3}MnO_3$ (LOMO), and $Y_{1-x}Ca_xMnO_3$(YCMO), and high-temperature super conductor (HTSC) materials.

13. A common bit/common source line high density one transistor/one resistor (1T1R) R-RAM array comprising:

a first transistor having a drain and a source formed in a first level, and a gate formed in an overlying level;

a second transistor having a dram and a source formed in the first level, and a gate formed in an overlying level;

an insulator formed in the first level, interposed between the drains of the first and second transistors, and in a second level overlying the first level;

a first memory resistor formed in the second level and connected to the drain of the first transistor;

a second memory resistor formed in the second level and connected to the drain of the second transistor; and, a common bit line connected to the first and second memory resistors.

14. The R-RAM array of claim 13 wherein the first memory resistor overlies the drain of the first transistor; and, wherein the second memory resistor overlies the drain of the second transistor.

15. The R-RAM array of claim 14 further comprising:

a third transistor having a drain and a source formed in n first level, and a gate formed in an overlying level;

a common source line connected to the sources of the second and third transistors.

16. The R-RAM array of claim 15 wherein the common source line is formed in the second level overlying the sources of the second and third transistors.

17. The R-RAM array of claim 16 wherein the common source line is also formed in a third level, overlying the second level.

18. The R-RAM array of claim 17 wherein the common source line is a metal material selected from the group including Al, Ti, AlSi, and Cu.

19. The R-RAM array of claim 18 wherein the common bit line is a selected from the group including Al, Ti, AlSi, and Cu.

20. The R-RAM array of claim 19 wherein the common bit and common source lines are formed in a common level.

21. The R-RAM array of claim 17 further comprising:

a common word line formed, in a level overlying the first level and connected to the gates of the first, second, and third transistors.

22. The R-RAM array of claim 21 in which n is an even number; and, the R-RAM array further comprising:

a row of n sequential transistors with gates, sources, and drains, including the first, second, and third transistors, the row of transistors including (n−2) interior transistors;

n memory resistors, including the first and second memory resistors, each connected to a corresponding one of the drains of the n transistors;

wherein the word line is connected to the gates of each of the n transistors;

((n/2)−1) common bit lines, each common bit line operatively connected to a corresponding pair of adjoining interior transistors through corresponding memory resistors; and, (n/2) common source lines, each common source line connected to corresponding pairs of adjoining transistor sources.

23. The R-RAM array of claim 22 further comprising:
a first exterior bit line (B1) operatively connected to a (n=1) transistor through a corresponding memory resistor; and,
a second exterior bit line (Bn) operatively connected to an nth transistor through a corresponding memory resistor.

24. The R-RAM array of claim 23 further comprising:
m rows of n sequential transistors with gates, sources, and drains, each row of transistors including (n−2) interior transistors;
n memory resistors for each of the m rows, each connected to a corresponding one of the drains of the n transistors in each row;
m word lines, each word line connected to the gates of each of the n transistors in a corresponding row;
wherein the ((n/2)−1) common bit lines are each operatively connected to corresponding pairs of adjoining interior transistors, through corresponding memory resistors, in each row; and,
wherein the (n/2) common source lines are each connected to corresponding pairs of adjoining transistor sources, in each row.

25. The R-RAM array of claim 24 wherein the first exterior bit line is operatively connected to the (n=1) transistor, through a corresponding memory resistor, in each row; and,
wherein the second exterior bit line is operatively connected to the nth transistor, through a corresponding memory resistor, in each row.

26. The R-RAM array of claim 21 in which n is an odd number; and,
the R-RAM array further comprising:
a row of n sequential transistors with gates, sources, and drains, including the first, second, third transistors, the row of transistors including (n−1) interior transistors;
n memory resistors, including the first and second memory resistors, each connected to a corresponding one of the drains of the n transistors;
wherein the word line is connected to the gates of each of the n transistors;
((n−1)/2) common bit lines, each common bit line operatively connected to a corresponding pair of adjoining interior transistors through corresponding memory resistors; and,
((n−1)/2) common source lines, each common source line connected to corresponding pairs of adjoining transistor sources.

27. The R-RAM array of claim 26 further comprising:
a first exterior bit line (B1) operatively connected to a (n=1) transistor through a corresponding memory resistor; and,
a first exterior source line (Sn) connected to the source of an nth transistor.

28. The R-RAM array of claim 27 further comprising
m rows of n sequential transistors with gates, sources, and drains, each row of transistors including (n−1) interior transistors;
n memory resistors for each of the m rows, each connected to a corresponding one of the drains of the n transistors in each row;
m word lines, each word line connected to the gates of each of the n transistors in a corresponding row;
wherein the ((n−1)/2) common bit lines are each operatively connected to corresponding pairs of adjoining interior transistors, through corresponding memory resistors, in each row; and,
wherein the ((n−1)/2) common source lines are each connected to corresponding pairs of adjoining transistor sources, in each row.

29. The R-RAM array of claim 28 wherein the first exterior bit line is operatively connected to the (n=1) transistor, through a corresponding memory resistor, in each row; and,
wherein the first exterior source line is connected to the source of the nth transistor in each row.

30. The R-RAM array of claim 14 wherein the common bit line is formed in a third level overlying the second level.

31. The R-RAM array of claim 13 wherein the memory resistors are made from a material selected from the group including colossal magnetoresistive (CMR) films, such as $Pr_{0.3}Ca_{0.7}MnO_3$ (PCMO), $La_{0.7}Ca_{0.3}MnO_3$ (LCMO), and $Y_{1-x}Ca_xMnO_3$ (YCMO), and high-temperature super conductor (HTSC) materials.

* * * * *